United States Patent
Harrigan et al.

(10) Patent No.: US 12,167,572 B2
(45) Date of Patent: Dec. 10, 2024

(54) SYSTEMS AND METHODS FOR ELECTROMAGNETIC SHIELDING OF THERMAL FIN PACKS

(71) Applicant: Microsoft Technology Licensing, LLC, Redmond, WA (US)

(72) Inventors: Jason A. Harrigan, Sultan, WA (US); David Bennett Johnson, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 332 days.

(21) Appl. No.: 17/556,270

(22) Filed: Dec. 20, 2021

(65) Prior Publication Data
US 2023/0200017 A1    Jun. 22, 2023

(51) Int. Cl.
*H05K 7/20*   (2006.01)
*H05K 9/00*   (2006.01)

(52) U.S. Cl.
CPC ....... *H05K 7/2039* (2013.01); *H05K 7/20281* (2013.01); *H05K 9/0088* (2013.01)

(58) Field of Classification Search
CPC ............. H05K 7/2039; H05K 7/20281; H05K 9/0088; H05K 9/0041
See application file for complete search history.

(56) References Cited

U.S. PATENT DOCUMENTS

| | | | |
|---|---|---|---|
| 2004/0244947 A1* | 12/2004 | Chen | F28F 13/06 165/80.3 |
| 2009/0154091 A1* | 6/2009 | Yatskov | H05K 7/2039 165/104.33 |
| 2014/0262194 A1 | 9/2014 | Hernon et al. | |
| 2017/0185117 A1* | 6/2017 | Szeremeta et al. | H05K 7/2039 |
| 2017/0269647 A1* | 9/2017 | Hsieh et al. | H05K 7/2039 |
| 2019/0043783 A1* | 2/2019 | Kaslusky et al. | H01L 23/467 |
| 2021/0120698 A1* | 4/2021 | Huala et al. | H05K 7/20172 |
| 2023/0090230 A1* | 3/2023 | Inoue | H05K 7/2039 165/80.4 |

FOREIGN PATENT DOCUMENTS

| | | | | |
|---|---|---|---|---|
| CN | 103702541 A | 4/2014 | | |
| CN | 203761738 U | 8/2014 | | |
| CN | 104684341 A | 6/2015 | | |
| CN | 107170722 A | * 9/2017 | ........... H01L 23/467 |
| CN | 108633217 A | * 10/2018 | ........ H05K 7/20409 |
| EP | 2685493 A2 | 1/2014 | | |

(Continued)

OTHER PUBLICATIONS

CN 108633217 A Translation (Year: 2018).*

(Continued)

Primary Examiner — Elizabeth J Martin
Assistant Examiner — Dario Antonio Deleon
(74) Attorney, Agent, or Firm — Rainier Patents, P.S.

(57) ABSTRACT

A thermal management device includes a fin pack and a plurality of channels. The fin pack has a hot side and a cold side, and the plurality of channels in the fin pack provide fluid communication from the hot side to the cold side. The channels have a transverse dimension and a longitudinal dimension, and the longitudinal dimension is at least 2.5 times the transverse dimension.

20 Claims, 6 Drawing Sheets

(56) References Cited

FOREIGN PATENT DOCUMENTS

| | | |
|---|---|---|
| JP | S59186017 A | 10/1984 |
| NZ | 314487 A | 9/1999 |

OTHER PUBLICATIONS

CN 107170722 A Translation (Year: 2017).*
"International Search Report and Written Opinion Issued in PCT Application No. PCT/US22/050978", Mailed Date: May 8, 2023, 19 Pages.
"Invitation to Pay Additional Fees Issued in PCT Application No. PCT/US22/050978", Mailed Date: Mar. 14, 2023, 12 Pages.

* cited by examiner

SYSTEMS AND METHODS FOR ELECTROMAGNETIC SHIELDING OF THERMAL FIN PACKS

BACKGROUND

Background and Relevant Art

Electronic devices (such as computing devices and gaming consoles) are provided with fin packs for thermal efficiency, but due to their current construction they are not adapted to provide radio frequency (RF) shielding. Conventional systems use a RF shielding mesh with perforated metal holes after the fin pack, which impede air flow and hinder thermal efficiency.

BRIEF SUMMARY

In some embodiments, a thermal management device includes a fin pack and a plurality of channels. The fin pack has a hot side and a cold side, and the plurality of channels in the fin pack provide fluid communication from the hot side to the cold side. The channels have a transverse dimension and a longitudinal dimension, and the longitudinal dimension is at least 2.5 times the transverse dimension.

In some embodiments, a thermal management device includes a thermal portion and a shielding portion. The thermal portion is proximate a hot side of the thermal management device, and the shielding portion is proximate a cold side opposite the hot side. The thermal portion is configured to receive heat from a heat source. The shielding portion includes plurality of channels that provide fluid communication from the hot side to the cold side. The channels have a transverse dimension and a longitudinal dimension, and the longitudinal dimension is at least 2.5 times the transverse dimension.

In some embodiments, an electronic device includes a heat source and a thermal management device thermally connected to the heat source. The thermal management device includes a fin pack and a plurality of channels. The fin pack has a hot side and a cold side, and the plurality of channels in the fin pack provide fluid communication from the hot side to the cold side. The channels have a transverse dimension and a longitudinal dimension, and the longitudinal dimension is at least 2.5 times the transverse dimension.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 1-2 is a top view of the thermal management device of FIG. 1-1;

FIG. 2 is a perspective view of a fin of a thermal management device, according to at least one embodiment of the present disclosure;

DETAILED DESCRIPTION

Figure 1:
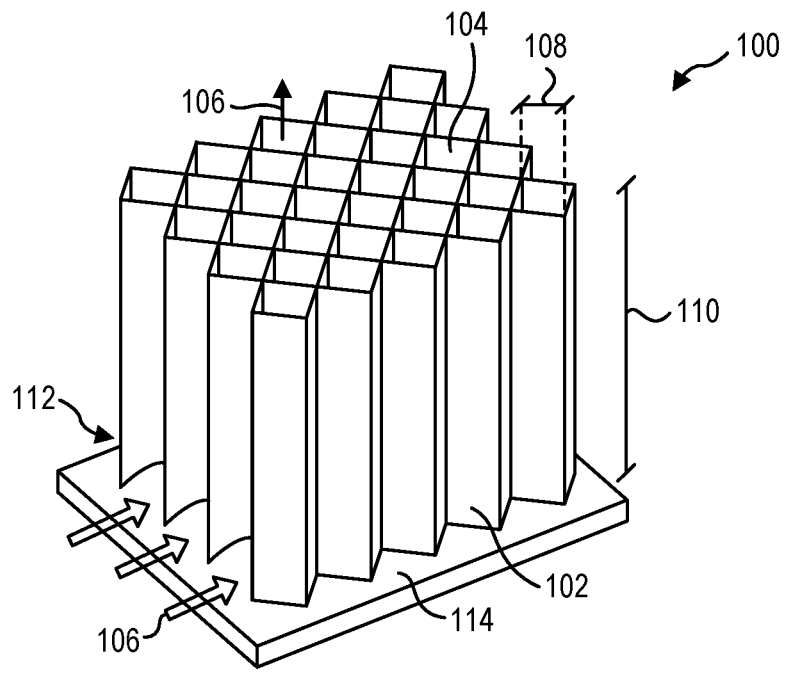
FIG. 1-1 is a perspective view of a thermal management device, according to at least one embodiment of the present disclosure.

The present disclosure relates generally to systems and methods for thermal management and electromagnetic interference (EMI) or radio frequency (RF) shielding. More particularly, the thermal management devices described herein are configured to provide EMI or RF shielding for a computing device or a specialized video game console. In some embodiments, thermal management devices according to the present disclosure that are configured to dissipate heat through an aperture in a device housing from one or more heat source in the electronic device, such as a personal computer or video game console, while limiting and/or preventing transmission of EMI into or out of the aperture in the device housing. In some embodiments, a thermal management device is positioned on a heat spreader to receive heat from a computing component of the electronic device. In some examples, the computing component, such as a processor, system memory, hardware storage device, networking device, etc. may be susceptible to EMI that compromises the performance of the computing component. In other examples, the computing component may generate EMI that adversely affects the performance of other computing components of the electronic device.

In some embodiments, a thermal management device according to the present disclosure is thermally connected to a heat spreader, which receives heat from at least one heat source in the electronic device. In some embodiments, the heat source is a processor, such as a central processing unit (CPU), a graphical processing unit (GPU); a storage device, such as random-access memory (RAM), other volatile memory, non-volatile memory, or combinations thereof. In some embodiments, the heat source is coupled directly to the thermal management device. In some embodiments, the heat source is thermally connected to the thermal management device with at least one thermally conductive or convective element therebetween.

In some examples, the heat source is thermally connected to the thermal management device by a thermal interface material (TIM), such as a thermal paste, sandwiched between a surface of the heat source and a surface of the thermal management device. In some examples, the heat source is thermally connected to the thermal management device by a heat pipe, vapor chamber, heat spreader, or other thermally conductive or convective element that transports heat from a surface of the heat source to a surface of the thermal management device. The thermal management device is thermally connected to the heat source when at least element of the thermal management system is intended to physically connect the thermal management device to the heat source. In other words, a thermal management device that receives heat from the heat source only by ambient air flowing therebetween is not thermally connected, while a thermal management device connected to a heat source by a vapor chamber with a two-phase working fluid moving therein is thermally connected when a surface of the vapor chamber contacts a surface of the heat source and a surface of the thermal management device. In another example, a thermal management device is thermally connected to the heat source when the heat source is in contact with a first TIM, which contacts a surface of a heat pipe, which contacts a second TIM, which contacts a surface of the thermal management device.

In some embodiments, a thermal management device according to the present disclosure allows airflow therethrough to reject excess heat to the ambient atmosphere while also limiting and/or preventing EMI from passing through the thermal management device. In some embodiments, the thermal management device includes a plurality of channels through which air can flow to receive heat from the material of the channel walls and carry away the excess heat. The channels have a maximum transverse dimension (e.g., width) that is less than a longitudinal dimension (e.g., length) to limit the passage of EMI through the channel. In some embodiments, a channel, as described herein, is a continuous segment of which a transverse cross-section is electrically connected.

FIG. 1 is a perspective view of an embodiment of a thermal management device 100 according to the present disclosure. The thermal management device 100 includes a fin pack 102 that includes a plurality of channels 104 therein. In some embodiments, the channels 104 allow airflow 106 therethrough. The channels 104 have a maximum transverse dimension 108 that is transverse to the direction of airflow in a longitudinal direction of the channels 104. The maximum transverse dimension 108 is related to a longitudinal dimension 110 of the channels 104.

In some embodiments, a fin pack is a structure including one or more thermally conductive elements arranged to form a plurality of channels through which a fluid, such as air or water, can flow. The one or more thermally conductive elements transfer heat through the one or more thermally conductive elements from a heat source to the fluid to exhaust the heat from the heat source. In some embodiments, the channels are parallel to one another. In other embodiments, the channels converge or diverge. A fin pack may include a plurality of thermally conductive elements (e.g., fins) arranged to provide the channels, or a single thermally conductive element bent, stamped, cast, additively manufactured, or otherwise formed to provide the channels, such as a single sheet bent to form a plurality of fins.

The longitudinal dimension 110 of the channel 104 and the maximum transverse dimension 108 form a channel ratio. In some embodiments, the channel ratio is at least 2:1. For example, the longitudinal dimension 110 is at least double the maximum transverse dimension 108. In some embodiments, the channel ratio is at least 2.5:1. For example, the longitudinal dimension 110 is at least two and a half times the maximum transverse dimension 108. In some embodiments, the channel ratio is at least 3:1. For example, the longitudinal dimension 110 is at least three times the maximum transverse dimension 108. In some embodiments, the channel ratio is at least 5:1. For example, the longitudinal dimension 110 is at least five times the maximum transverse dimension 108. In a particular example, the longitudinal dimension 110 is 10.0 mm and the maximum transverse dimension 108 is no more than 2.0 mm.

As used herein, a channel 104 is a closed conduit that allows fluid flow in substantially one direction, such as a tube, pipe, or other structure with a transverse aspect ratio of less than 5:1. The transverse dimension 108 is measured through a centerpoint of the transverse area of the channel 104, and the aspect ratio is the ratio of the minimum value of the transverse dimension 108 through the centerpoint to the maximum dimension through the centerpoint. For example, a circular channel has a transverse aspect ratio of 1:1. In another example, a square channel (such as the channels 104 of FIG. 1-1 and FIG. 1-2) has a transverse aspect ratio of 1.41:1. In another example, a rectangular channel that is 4 mm by 2 mm has a transverse aspect ratio of 1.73:1.

In an example, parallel fins of a conventional fin pack allow airflow in substantially two directions. In some embodiments, a channel 104 according to the present disclosure has a transverse cross-section that is square, rectangular, triangular, other regular polygonal, non-regular polygonal, circular, elliptical, other regular curved shapes, irregular curved shapes, or combinations thereof. The maximum transverse dimension 108 of the channel 104 is the transverse dimension, irrespective of orientation relative to the longitudinal direction, that is greatest.

For example, the EM shielding of a Faraday-cage style shield is based upon the wavelength and the required attenuation at that wavelength. For example, the higher the frequency, the shorter the wavelength of the EM radiation. The shorter the wavelength, the smaller the pores or channel openings need to be to attenuate the EM radiation.

A Faraday-style shield operates by balancing the electrical fields on either side of the shield. A substantially continuous Faraday shield allows the free conduction of electrical charge through the walls of the Faraday shield and becomes a hollow conductor. Introducing an aperture into the Faraday shield allows the leakage of EM radiation through the aperture. For the Faraday cage to function as such, the aperture size must be many times smaller than the wavelength of the interest. By positioning the conductive fin pack in an aperture of an electronic device housing, the fin pack divides the aperture into a collection of smaller openings based on the channel size of the fin pack. However, as the fin pack channels are elongated, the fin pack offers additional attenuation for EM radiation wavelengths smaller than the channel size, as the EM radiation must pass through the length of the channels to leak from the fin pack. For example, attenuation may be controlled by the grounding of the fin pack, distance and/or position of the antenna relative to the Faraday cage, fin pack configuration, the maximum transverse dimension and longitudinal dimension of the channels, quantity of the channels, frequency, other factors, or combinations thereof.

In some embodiments, a thermal management device according to the present disclosure attenuates EMI in a frequency range of 2.2 GHz to 2.6 GHz. In other embodiments, a thermal management device attenuates EMI in a frequency range of 800 MHz to 900 MHz. In further embodiments, a thermal management device attenuates EMI in a frequency range of 1.8 GHz to 2.0 GHz. In yet further embodiments, a thermal management device attenuates EMI in a frequency range of 5.0 GHz to 6.0 GHz.

In some embodiments, a thermal management device according to the present disclosure attenuates EMI in the frequency range by at least 20 dB throughout the frequency range. In other embodiments, a thermal management device attenuates EMI in the frequency range by at least 30 dB throughout the frequency range. In yet other embodiments, a thermal management device attenuates EMI in the frequency range by at least 40 dB throughout the frequency range.

In some embodiments, a thermal management device according to the present disclosure attenuates EMI in the frequency range by an average of at least 20 dB across the frequency range. In other embodiments, a thermal management device attenuates EMI in the frequency range by an average of at least 30 dB across the frequency range. In yet other embodiments, a thermal management device attenuates EMI in the frequency range by an average of at least 40 dB across the frequency range.

While reducing the channel cross-sectional area can increase the attenuation of the EM radiation, the reduced channel cross-sectional area will also reduce the airflow through the channel, adversely affecting the thermal management performance Embodiments of fin packs according to the present disclosure increase airflow through channels of the fin pack to improve thermal performance while providing sufficient EMI shielding across the fin pack.

In some embodiments, the fin pack and/or walls of the channels include an electrically conductive material. Examples of suitable materials include, but are not limited to copper, aluminum, iron, tin, magnesium, or alloys thereof; graphite; and electrically conductive polymers. In some embodiments, the fin pack and/or walls of the channels include a thermally conductive material. Examples of suitable materials include, but are not limited to copper, aluminum, iron, tin, magnesium, or alloys thereof; graphite; and thermally conductive polymers.

In some implementations, the thermally conductive material has a thermal conductivity in a range having an upper value, a lower value, or upper and lower values including any of 100 Watts per meter-Kelvin (W/m·K), 125 W/m·K, 150 W/m·K, 175 W/m·K, 200 W/m·K, 250 W/m·K, 300 W/m·K, 400 W/m·K, 450 W/m·K, or any values therebetween. For example, the thermal conductivity may be greater than 100 W/m·K. In other examples, the thermal conductivity may be less than 450 W/m·K. In yet other examples, the thermal conductivity may be between 100 W/m·K and 450 W/m·K. In further examples, the thermal conductivity may be greater than 150 W/m·K. In at least one example, the thermal conductivity may be greater than 250 W/m·K.

In at least one embodiment, the fin pack is made of copper to provide both electrical and thermal conductivity. In another embodiment, the fin pack is made of aluminum to provide both electrical and thermal conductivity. In yet another embodiment, the fin pack is made of a combination of copper in a first portion and aluminum in a second portion to provide different electrical and thermal conductivity properties in the different portions.

Referring again to FIG. 1-1, in some embodiments, the fin pack 102 contacts and/or is supported by a base 114. In some embodiments, the base 114 is a heat spreader. In other examples, the base 114 is a part of the housing of the electronic device being cooled. In yet other examples, the base 114 is a heat source. In a conventional fin pack, air is free to move in two dimension between parallel fins. The plurality of channels 104 of a thermal management device 100 according to the present disclosure include an intake 112 between the channels 104 and the base 114. In some embodiments, the intakes 112 allow the airflow 106 to enter the hot side of the channel 104 before flowing upward through the channels 104 to exit at the cold side of the channels 104. In some embodiments, the intake 112 is proximate a heat spreader or heat source and the airflow 106 receives heat from the base 114. In some embodiments, the heat source is thermally connected to another portion of the thermal management device 100, as will be described in more detail herein, and the intakes 112 allow airflow 106 to enter proximate the base 114 to draw air across thermal conduits that thermally connect the thermal management device 100 to the heat source.

Figures 1, 2:
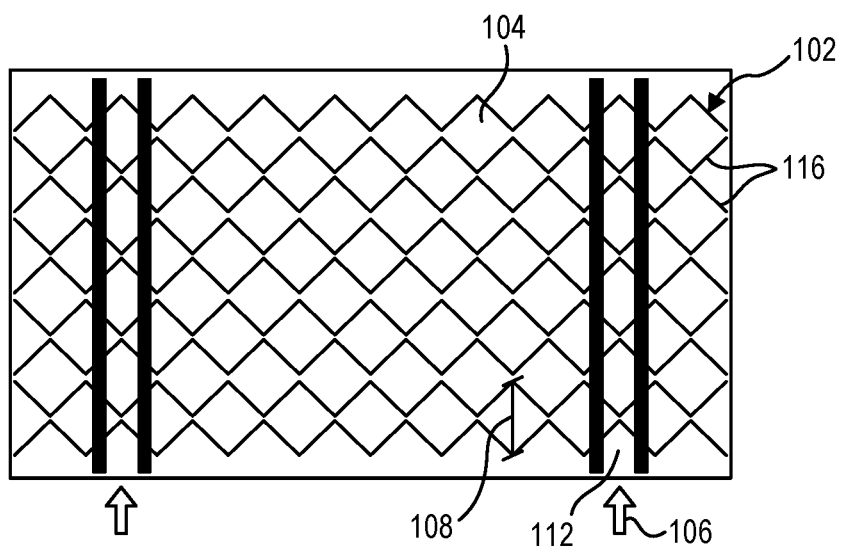
Figure 2:
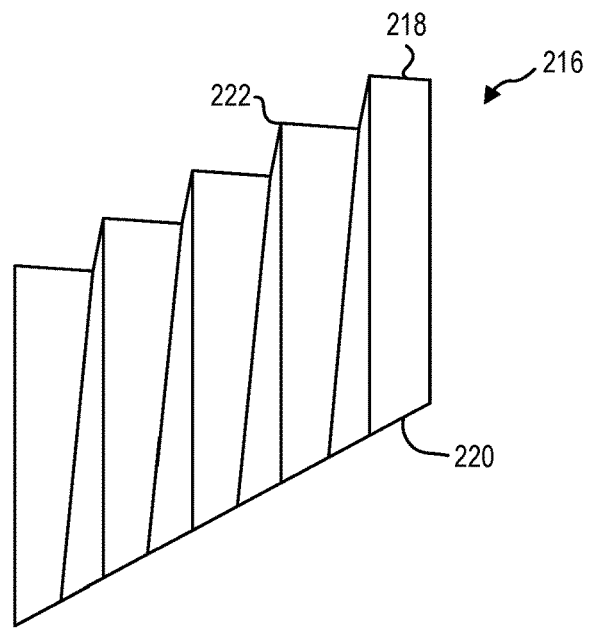

FIG. 1-2 is a top view of the thermal management device 100 of FIG. 1-1. The intakes 112 are schematically illustrated as parallel walls of the intake path underneath the fin pack 102. The intakes 112 allow the airflow 106 to flow underneath and into the channels 104 before rising up through the channels 104 and out of the fin pack 102. The fin pack 102 includes a plurality of bent fins 116 that define a plurality of square channels 104 with a maximum transverse dimension 108 between the corners of the squares. The bent sheets can be individual fins 116 that are stamped to shape and connected to one another (such as by welding, soldering, or a conductive adhesive) to define the channels 104. In some embodiments, the intakes 112 are formed in the bottom of the fins 116 prior to stamping into the bent form. In some embodiments, the intakes 112 are cut into the fin 116 or fin pack 102 after forming of the bent fins 116.

Figure 3:
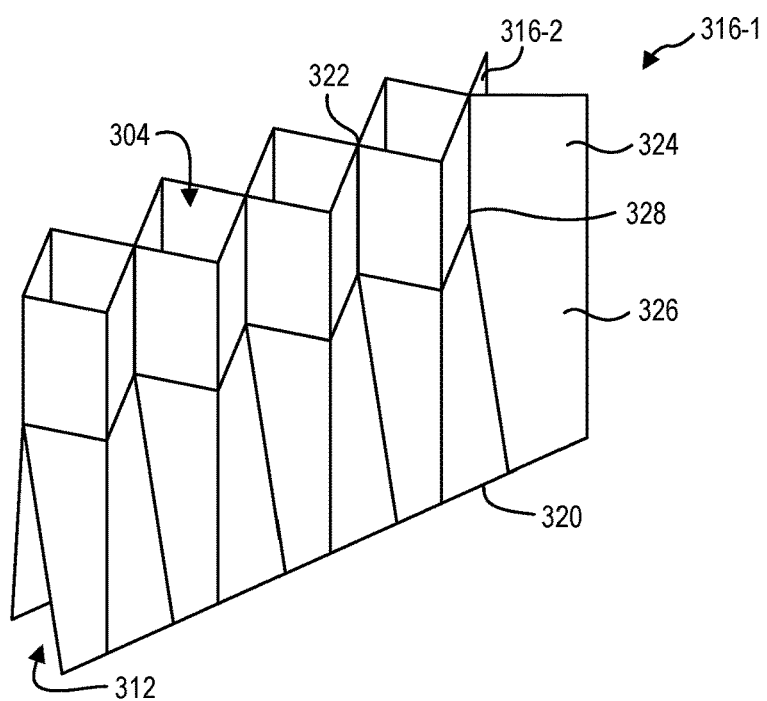
FIG. 3 is a perspective view of another fin of a thermal management device, according to at least one embodiment of the present disclosure.

FIG. 2 and FIG. 3 illustrate additional embodiments of stamped or formed fins with integrally formed intakes through the forming of the fins. FIG. 2 is an example of a fin 216 that is formed from a single piece of material. The top edge 218 of the fin 216 is stamped to form the bent pattern that defines a channel (such as the square channels 104 of FIG. 1-1), and the fin 216 tapers to a substantially straight bottom edge 220. When a plurality of fins 216 are positioned with corners 222 of the top edge 218 contacting one another, the resulting fin pack 216 defines a plurality of channels proximate the top edge 218 while defining a plurality of intakes proximate the bottom edge 220. In some embodiments, the channels formed by a fully tapered fin 216 of FIG. 2 have a short longitudinal dimension.

FIG. 3 illustrates another embodiment of a stamped fin 316 that is partially tapered and partially straight in the vertical direction. In some embodiments, the straight portion 324 has corners 322 similar to the top edge 218 of the fin 216 described in relation to FIG. 2. The tapered portion 326 transitions the fin 316 from the bent structure of the straight portion 324 to the straight edge at the bottom edge 320 of the fin 316. In some embodiments, the tapered portion 326 is similar in structure to the fin 216 described in relation to FIG. 2, where the top edge 218 of the fin 216 of FIG. 2 is the transition line 328 between the bottom of the straight portion 324 and the top of the tapered portion 326.

In some embodiments, the straight portion 324 has straight vertical corners 322 that allow a first fin 316-1 and second fin 316-2 to contact along a longitudinal length of the corners 322 to form channels 304. In some embodiments, the tapered portions 326 of the first fin 316-1 and second fin 316-2 taper away from the contacting corners 322 and create a continuous space between the first fin 316-1 and second fin 316-2. The continuous space therebetween provides an intake 312 to the bottom end of the channels 304, allowing airflow laterally into a fin pack and up through the channels 304. The channels 304, therefore, provide both thermal management and EMI shielding in addition to the thermal management provided by the surface area of the tapered portion 326 of the first fin 316-1 and second fin 316-2.

In some embodiments, the channels 304 formed by the first fin 316-1 and second fin 316-2 (and any additional fins in contact therewith to form a fin pack) have the channel ratios described herein. For example, the straight portions 324 of the first fin 316-1 and second fin 316-2 that form the channels 304 may have the channel ratios described herein independently of the longitudinal dimension of the tapered portion 326. While the tapered portions 326 contribute to the thermal performance of a thermal management device according to the present disclosure, the tapered portions that do not form a channel 304 are not considered in the channel ratio. As such, the channels 304 formed by the straight portions 324 of the first fin 316-1 and second fin 316-2 create a shielding portion of a fin pack, while the tapered portions 326 that do not form channels 304 create a thermal portion of a fin pack.

Figure 4:
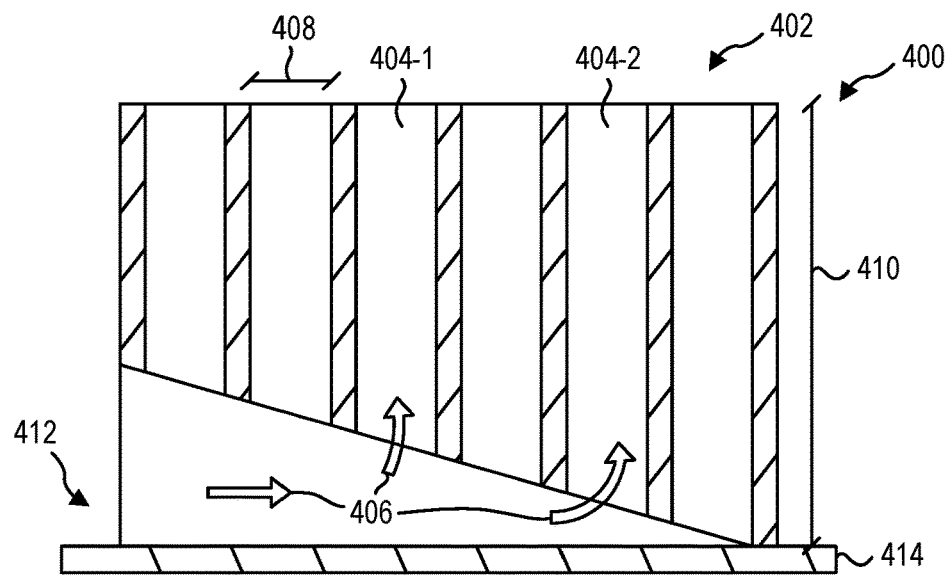
FIG. 4 is a side cross-sectional view of a thermal management device, according to at least one embodiment of the present disclosure.

In some embodiments, the intake has other forms. An intake such as the tunnels describe in relation to FIG. 1-1 and FIG. 1-2 through the fin pack can create impedance to moving airflow through, especially in the center of the fin pack. As a heat source may be greatest in temperature near the center, some embodiments benefit from an intake that lowers impedance to airflow through all channels. FIG. 4 is an embodiment of a thermal management device 400 with an intake 412 that is a sloped plane at the hot side of the fin pack 402.

In some embodiments, the fin pack 402 forms a plurality of channels 404 therethrough above a base 414. Because the channels 404 of the fin pack 402 cannot receive air sideways like a conventional parallel fin pack, the bottom of the channels 404 terminate in a sloped plane wherein the longitudinal dimension 410 of the channels 404 vary between channels 404. The sloped plane allows continued airflow 406 past a first channel 404-1 to a second channel 404-2 farther into the fin pack 402.

As described herein, the longitudinal dimension 410 can vary between channels 404. In some embodiments, the maximum transverse dimension 408 of a channel 404 can be changed based at least partially on the longitudinal dimension 410 of the channel 404. For example, the longitudinal dimension 410 of the first channel 404-1 is less than a longitudinal dimension 410 of the second channel 404-2. In some embodiments, the first channel 404-1 has a maximum transverse dimension 408 that is less than that of the second channel 404-1, and the channel ratio of the first channel 404-1 and the second channel 404-2 can be substantially equal. By varying the maximum transverse dimension 408 with the longitudinal dimension 410, the EMI attenuation can be maintained across the thermal management device 400.

Figure 5:
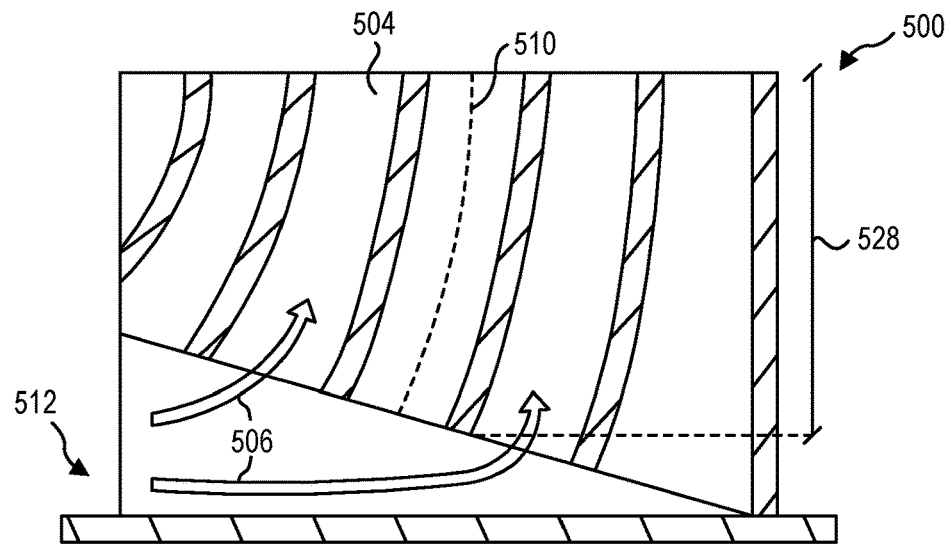
FIG. 5 is a side cross-sectional view of a thermal management device with curved channels, according to at least one embodiment of the present disclosure.

FIG. 5 is a side cross-sectional view of another embodiment of a thermal management device 500 with an angled intake 512. In some embodiments, a thermal management device 500 can reduce airflow impedance into a channel 504 and/or increase airflow velocity in a channel 504 by angling the intake 512 toward the transverse direction. In some embodiments, at least one channel 504 includes a change of direction, such as a curved portion and/or a discontinuous change of direction. The channel 504 can receive airflow 506 from the side through the intake 512 and into the channel 504. In some embodiments, a curved portion of the channel 504 can then direct the lateral airflow 506 to change the direction of the airflow 506 upward through channel 504 and exhaust hot air from the thermal management device 500.

In some embodiments, a channel 504 with a curved portion has a longitudinal dimension 510 that follows the curve of the channel 504, creating a longer longitudinal dimension 510 of the channel 504 than a vertical height 528 of the channel 504. The channel ratio is based upon the longitudinal dimension 510 and the maximum transverse dimension, which may allow a curved channel 504 to have a larger maximum transverse dimension than would otherwise be possible for a straight channel 504 of the same vertical height 528.

Figure 6:
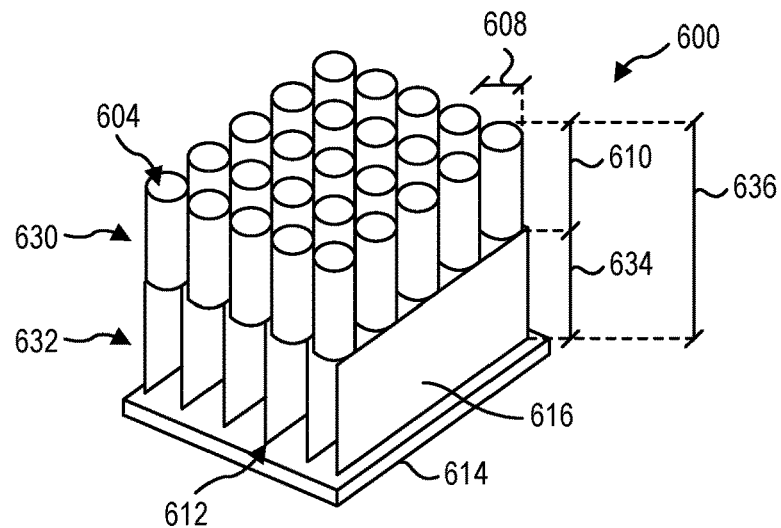
FIG. 6 is a perspective view of a thermal management device with a shielding portion and a thermal portion, according to at least one embodiment of the present disclosure.

FIG. 6 is a perspective view of an embodiment of a thermal management device 600 with a shielding portion 630 and a thermal portion 632. While some embodiments of thermal management devices have a shielding portion and a thermal portion that are integrally formed with one another, such as described in relation to FIG. 3, in some embodiments, the shielding portion 630 and the thermal portion 632 have different structures and are coupled to one another by soldering, welding, brazing, a conductive adhesive, or combinations thereof.

In some embodiments, a thermal portion 632 provides clearance for an intake 612 into a hot side of the channels 604 of the shielding portion 630. The shielding portion 630 has a maximum transverse dimension 608 and a longitudinal dimension 610 that correspond to a channel ratio, as described herein. In some embodiments, the thermal portion 632 has a thermal height 634 that that provides clearance above a base 614 and/or surface area to dissipate heat.

In some embodiments, the longitudinal dimension 610 of the channel(s) 604 is greater than the thermal height 634. In some embodiments, the longitudinal dimension 610 of the channel(s) 604 is less than the thermal height 634. In some embodiments, the longitudinal dimension 610 of the channel(s) 604 is substantially equal to the thermal height 634. In a particular example, the thermal height 634 of the thermal portion 632 of a thermal management device 600 is 5.0 mm, the longitudinal dimension 610 of a channel 604 of the shielding portion 630 is 5.0 mm, and the maximum transverse dimension 608 of the channel 604 is 2.0 mm Such an example has a channel ratio of 2.5:1 while the total height 636 of the thermal management device 600 is 10.0 mm.

Figure 7:
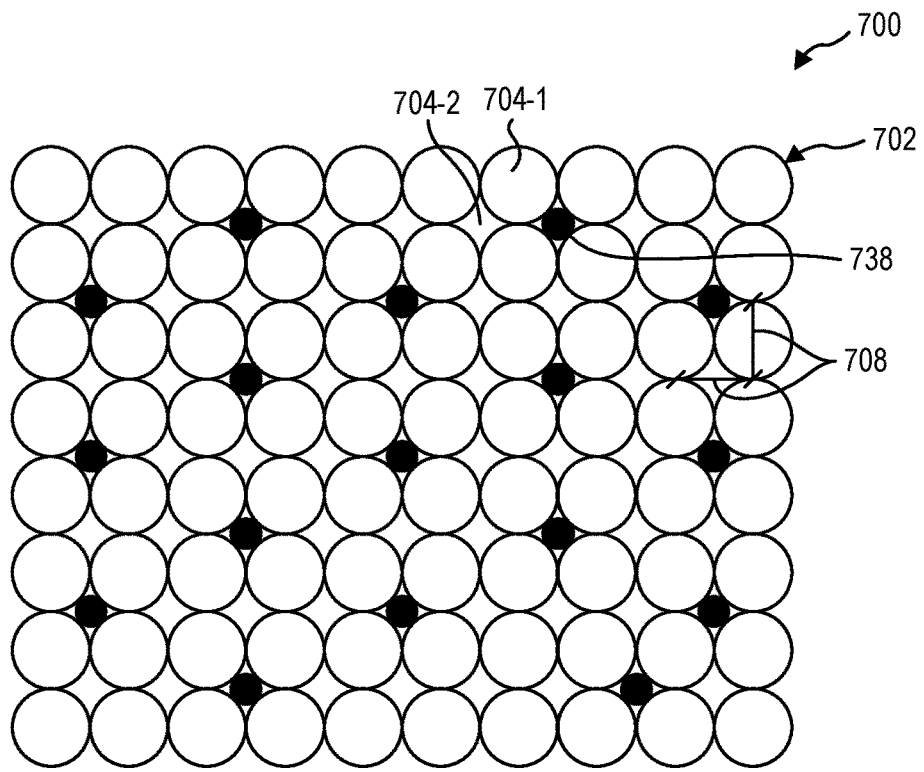
FIG. 7 is a top view of a thermal management device with cylindrical channels and thermal conduits, according to at least one embodiment of the present disclosure.

As shown in FIG. 6, in some embodiments, at least one of the channels 604 is cylindrical or has a circular transverse cross-section as defined by a cylindrical fin or plurality of fins that define a cylinder. In some embodiments, a channel 604 has an elliptical transverse cross-section. FIG. 7 is a top view of an embodiment of a thermal management device 700 with a plurality of cylindrical channels 704-1 therethrough. While some channels 704 have a circular transverse cross-section, secondary channels 704-2 have a non-circular area that is defined by the space between the circles of the cylindrical channels 704-1. While the areas of the cylindrical channels 704-1 and the secondary channels 704-2 are different, the maximum transverse dimension 708 of the cylindrical channels 704-1 and the secondary channels 704-2 is the same.

In some embodiments, one or more channels of a thermal management device can have a linear thermal conduit therein. A linear thermal conduit is any thermal conduit that conductively or convectively transfers heat from a heat source to the thermal management device. In some embodiments, a linear thermal conduit is a wire or rod of thermally conductive material, such as copper, aluminum, iron, carbon, or combinations thereof (such as steel). In some embodiments, a linear thermal conduit is a heat pipe the convectively moves heat from a first interface of the heat pipe to a second interface of the heat pipe.

At the higher temperature ("hot") interface of a heat pipe a liquid in contact with a thermally conductive solid surface turns into a vapor by absorbing heat from that surface. The vapor then travels along the heat pipe to a lower temperature ("cold") interface and condenses back into a liquid releasing the latent heat. The liquid then returns to the hot interface through, for example, capillary action, centrifugal force, or gravity, and the cycle repeats. Due to the high heat transfer coefficients for boiling and condensation, vapor cooling system heat pipes are effective thermal conductors. The effective thermal conductivity varies with heat pipe length and can approach 100 kW/(m K) for long heat pipes, in comparison with approximately 400 W/(m K) for copper.

In some embodiments, a linear thermal conduit is oriented parallel to at least one channel of a thermal management device. In FIG. 7, a linear thermal conduit 738 is in a secondary channel 704-2 of the thermal management device 700. The linear thermal conduit 738 contacts and transfers heat into a plurality of cylindrical channels 704 of the cylinder array fin pack 702. In some embodiments, the thermal management device 700 includes a plurality of linear thermal conduits 738 that each contact and transfer heat into 4 cylindrical channels 704-1, and each cylindrical channel 704-1 is adjacent to at least one linear thermal conduit 738. In some embodiments, cylindrical channels 704-1 proximate a side of the fin pack 702 may not be adjacent to a linear thermal conduit 738. In some embodiments, no cylindrical channel 704-1 is adjacent to more than one linear thermal conduit 738.

Figure 8:
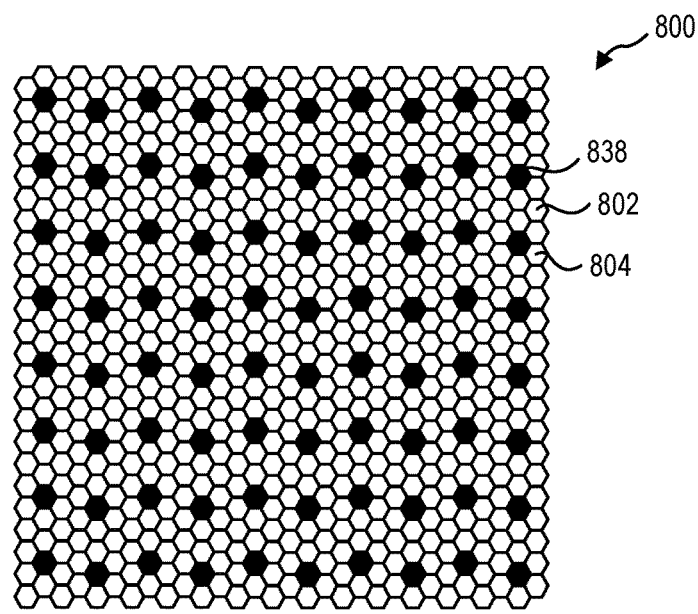
FIG. 8 is a top view of a thermal management device with hexagonal channels and thermal conduits, according to at least one embodiment of the present disclosure.

FIG. 8 is a top view of another embodiment of a thermal management device 800 with a hexagonal close pack (HCP) array of channels 804. Each channel 804 in a HCP array has the same transverse cross-sectional area. Some of the sectors of the HCP array in the fin pack 802 are a linear thermal conduit 838, which transfers heat into the fin pack 802. In some embodiments, the linear thermal conduits 838 are distributed through the HCP array such that no hexagonal channel 804 is adjacent to more than one linear thermal conduit 838 while no hexagonal channel 804 is more than one hexagonal channel 804 away from a linear thermal conduit 838.

Figure 9:
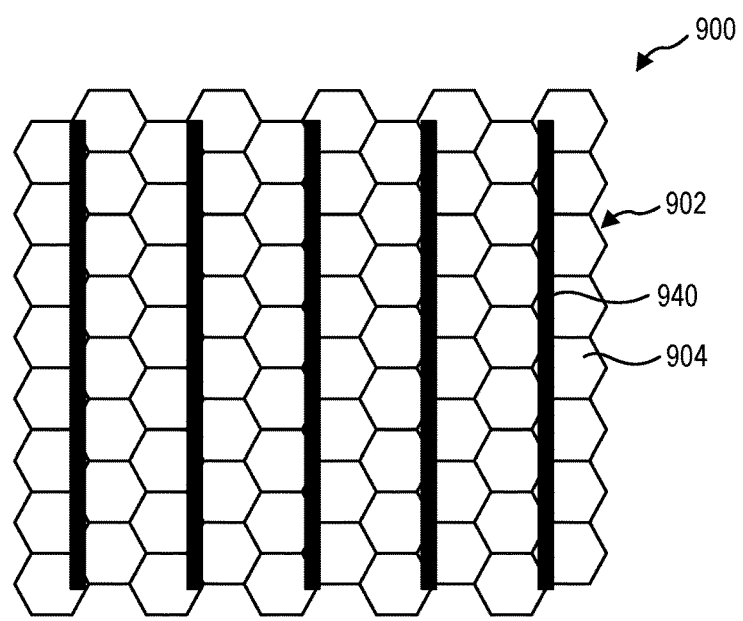
FIG. 9 is a top view of a thermal management device with sheet thermal conduits, according to at least one embodiment of the present disclosure.

FIG. 9 is a top view of another embodiment of a thermal management device 900 with a plurality of channels 904 therethrough. In some embodiments, a sheet thermal conduit 940 forms a wall of the channels 904. The sheet thermal conduit 940 illustrated in FIG. 9 is a planar sheet thermal conduit 940. In other embodiments, the sheet thermal conduit 940 has at least one curve or corner therein to complementarily mate between the channels 904 of the fin pack 902. For example, the sheet thermal conduit 940 may have a plurality of angular corners therein to complementarily mate with and/or form the walls of the hexagonal (or any other shaped) channels 904. For example, the walls of the hexagonal channels 904 may alternate between a sheet thermal conduit 940 and a solid wall 942 in the direction of the sheet thermal conduit 940, allowing each channel 904 of the thermal management device to contact a sheet thermal conduit 940. In some embodiments, each channel 904 of the thermal management device 900 is adjacent to one and only one sheet thermal conduit 940.

In some embodiments, a sheet thermal conduit 940 is a fin that is continuous from a thermal portion of the thermal management device 900 (such as described in relation to FIG. 6) into the shielding portion of the thermal management device 900. The fin conducts heat into the shielding portion, wherein the fin pack 902 of the shielding portion further disperses the heat and increases the surface area from which the heat can be transferred to the air and ultimately exhausted from the system.

The sheet thermal conduit 940 may be a solid fin of material or a plurality of pieces of material joined by welding, soldering, conductive adhesive, etc. In some embodiments, the sheet thermal conduit 940 is a vapor chamber that convectively moves heat through the sheet thermal conduit 940 using a working fluid. At a first interface of a vapor chamber a liquid working fluid in contact with a thermally conductive solid surface turns into a vapor phase of the working fluid by absorbing heat from that surface. The vapor working fluid then travels through an interior volume of the vapor chamber to a lower temperature second interface and condenses back into a liquid phase releasing the latent heat. The liquid working fluid then returns to the first interface through, for example, capillary action through a wicking structure, or gravity, and the cycle repeats. Due to the high heat transfer coefficients for boiling and condensation, vapor cooling system vapor chambers are effective thermal conductors similar to a heat pipe.

Figure 10:
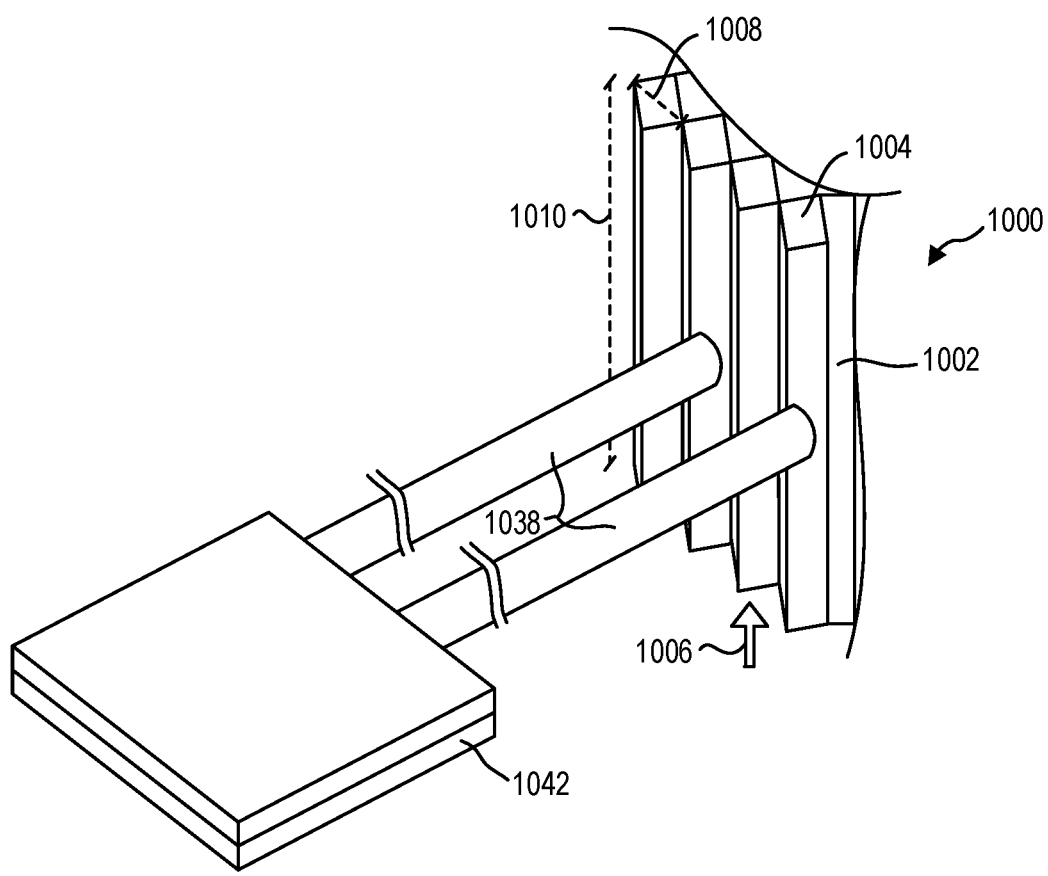
FIG. 10 is a perspective view of a thermal management device with transverse thermal conduits, according to at least one embodiment of the present disclosure.

FIG. 10 is a perspective view of an embodiment of a thermal management device 1000 with linear thermal conduits 1038. In some embodiments, the linear thermal conduits are parallel or substantially parallel to the longitudinal direction of the channels, such as described in relation to FIG. 7 and FIG. 8. In some embodiments, the linear thermal conduits 1038 are oriented perpendicular to or at another non-parallel angle to the longitudinal direction of the channels 1004. For example, the linear thermal conduits 1038 illustrated in FIG. 10 pass through a longitudinal center of the fin pack 1002 to transfer heat to the longitudinal center of the fin pack 1002. As described herein, the linear thermal conduits 1038 are, in some embodiments, connected to a heat source 1042, such as a CPU, GPU, hardware storage device, networking device, etc.

The heat can then conduct through the fin pack 1002 in either longitudinal direction to spread the heat before airflow 1006 through the channels 1004 exhausts the heat from the thermal management device 1000. As the EMI shielding or attenuation provided by the channels 1004 is related to the channel ratio (of the longitudinal dimension 1010 to the maximum transverse dimension 1008), the fin pack 1002 has a relatively long longitudinal dimension relative to conventional fin packs. In some embodiments, linear thermal conduits 1038 (or sheet thermal conduit) can take advantage of the relatively long longitudinal dimension by delivering heat to the longitudinal center. In doing so, the thermal management device can distribute heat in opposite directions from the linear thermal conduits 1038, effectively performing similar to two conventional fin packs connected to a hot surface.

In at least one embodiment according to the present disclosure, a thermal management device can increase both thermal performance and EMI attenuation relative to a conventional faraday cage and fin pack by combining the two into a single structure. Embodiments described herein provide intakes to increase airflow therethrough and reduce impedances to the airflow introduced by the elongated channels.

INDUSTRIAL APPLICABILITY

The present disclosure relates generally to systems and methods for thermal management and electromagnetic interference (EMI) or radio frequency (RF) shielding. More particularly, the thermal management devices described herein are configured to provide EMI or RF shielding for a computing device or a specialized video game console. In some embodiments, thermal management devices according to the present disclosure that are configured to dissipate heat through an aperture in a device housing from one or more heat source in the electronic device, such as a personal computer or video game console, while limiting and/or preventing transmission of EMI into or out of the aperture in the device housing. In some embodiments, a thermal management device is positioned on a heat spreader to receive heat from a computing component of the electronic device. In some examples, the computing component, such as a processor, system memory, hardware storage device, networking device, etc. may be susceptible to EMI that compromises the performance of the computing component. In other examples, the computing component may generate EMI that adversely affects the performance of other computing components of the electronic device.

In some embodiments, a thermal management device according to the present disclosure is thermally connected to a heat spreader, which receives heat from at least one heat source in the electronic device. In some embodiments, the heat source is a processor, such as a central processing unit (CPU), a graphical processing unit (GPU); a storage device, such as random-access memory (RAM), other volatile memory, non-volatile memory, or combinations thereof. In some embodiments, the heat source is coupled directly to the thermal management device. In some embodiments, the heat source is thermally connected to the thermal management device with at least one thermally conductive or convective element therebetween.

In some examples, the heat source is thermally connected to the thermal management device by a thermal interface material (TIM), such as a thermal paste, sandwiched between a surface of the heat source and a surface of the thermal management device. In some examples, the heat source is thermally connected to the thermal management device by a heat pipe, vapor chamber, heat spreader, or other thermally conductive or convective element that transports heat from a surface of the heat source to a surface of the thermal management device. The thermal management device is thermally connected to the heat source when at least element of the thermal management system is intended to physically connect the thermal management device to the heat source. In other words, a thermal management device that receives heat from the heat source only by ambient air flowing therebetween is not thermally connected, while a thermal management device connected to a heat source by a vapor chamber with a two-phase working fluid moving therein is thermally connected when a surface of the vapor chamber contacts a surface of the heat source and a surface of the thermal management device. In another example, a thermal management device is thermally connected to the heat source when the heat source is in contact with a first TIM, which contacts a surface of a heat pipe, which contacts a second TIM, which contacts a surface of the thermal management device.

In some embodiments, a thermal management device according to the present disclosure allows airflow therethrough to reject excess heat to the ambient atmosphere while also limiting and/or preventing EMI from passing through the thermal management device. In some embodiments, the thermal management device includes a plurality of channels through which air can flow to receive heat from the material of the channel walls and carry away the excess heat. The channels have a maximum transverse dimension (e.g., width) that is less than a longitudinal dimension (e.g., length) to limit the passage of EMI through the channel.

In some embodiments, a thermal management device includes a fin pack that includes a plurality of channels therein. In some embodiments, the channels allow airflow therethrough. The channels have a maximum transverse dimension that is transverse to the direction of airflow in a longitudinal direction of the channels. The maximum transverse dimension is related to a longitudinal dimension of the channels.

In some embodiments, a fin pack is a structure including one or more thermally conductive elements arranged to form a plurality of channels through which a fluid, such as air or water, can flow. The one or more thermally conductive elements transfer heat through the one or more thermally conductive elements from a heat source to the fluid to exhaust the heat from the heat source. In some embodiments, the channels are parallel to one another. In other embodiments, the channels converge or diverge. A fin pack may include a plurality of thermally conductive elements (e.g., fins) arranged to provide the channels, or a single thermally conductive element bent, stamped, cast, additively manufactured, or otherwise formed to provide the channels.

The longitudinal dimension of the channel and the maximum transverse dimension form a channel ratio. In some embodiments, the channel ratio is at least 2:1. For example, the longitudinal dimension is at least double the maximum transverse dimension. In some embodiments, the channel ratio is at least 2.5:1. For example, the longitudinal dimension is at least two and a half times the maximum transverse dimension. In some embodiments, the channel ratio is at least 3:1. For example, the longitudinal dimension is at least three times the maximum transverse dimension. In some embodiments, the channel ratio is at least 5:1. For example, the longitudinal dimension is at least five times the maximum transverse dimension. In a particular example, the longitudinal dimension is 10.0 mm and the maximum transverse dimension is no more than 2.0 mm.

As used herein, a channel is a closed conduit that allows fluid flow in substantially one direction, such as a tube, pipe, or other structure with a transverse aspect ratio of less than 5:1. The transverse dimension is measured through a centerpoint of the transverse area of the channel, and the aspect ratio is the ratio of the minimum value of the transverse dimension through the centerpoint to the maximum dimension through the centerpoint. For example, a circular channel has a transverse aspect ratio of 1:1. In another example, a square channel has a transverse aspect ratio of 1.41:1. In another example, a rectangular channel that is 4 mm by 2 mm has a transverse aspect ratio of 1.73:1.

In an example, parallel fins of a conventional fin pack allow airflow in substantially two directions. In some embodiments, a channel according to the present disclosure has a transverse cross-section that is square, rectangular, triangular, other regular polygonal, non-regular polygonal, circular, elliptical, other regular curved shapes, irregular curved shapes, or combinations thereof. The maximum transverse dimension of the channel is the transverse dimension, irrespective of orientation relative to the longitudinal direction, that is greatest.

For example, the EM shielding of a Faraday-cage style shield is based upon the wavelength and the required attenuation at that wavelength. For example, the higher the frequency, the shorter the wavelength of the EM radiation. The shorter the wavelength, the smaller the pores or channel openings need to be to attenuate the EM radiation.

A Faraday-style shield operates by balancing the electrical fields on either side of the shield. A substantially continuous Faraday shield allows the free conduction of electrical charge through the walls of the Faraday shield and becomes a hollow conductor. Introducing an aperture into the Faraday shield allows the leakage of EM radiation through the aperture. For the Faraday cage to function as such, the aperture size must be many times smaller than the wavelength of the interest. By positioning the conductive fin pack in an aperture of an electronic device housing, the fin pack divides the aperture into a collection of smaller openings based on the channel size of the fin pack. However, as the fin pack channels are elongated, the fin pack offers additional attenuation for EM radiation wavelengths smaller than the channel size, as the EM radiation must pass through the length of the channels to leak from the fin pack. For example, attenuation may be controlled by the grounding of the fin pack, distance and/or position of the antenna relative to the Faraday cage, fin pack configuration, the maximum transverse dimension and longitudinal dimension of the channels, quantity of the channels, frequency, other factors, or combinations thereof.

In some embodiments, a thermal management device according to the present disclosure attenuates EMI in a frequency range of 2.2 GHz to 2.6 GHz. In other embodiments, a thermal management device attenuates EMI in a frequency range of 800 MHz to 900 MHz. In further implementations, a thermal management device attenuates EMI in a frequency range of 1.8 GHz to 2.0 GHz.

In some embodiments, a thermal management device according to the present disclosure attenuates EMI in the frequency range by at least 20 dB throughout the frequency range. In other embodiments, a thermal management device attenuates EMI in the frequency range by at least 30 dB throughout the frequency range. In yet other embodiments, a thermal management device attenuates EMI in the frequency range by at least 40 dB throughout the frequency range.

In some embodiments, a thermal management device according to the present disclosure attenuates EMI in the frequency range by an average of at least 20 dB across the frequency range. In other embodiments, a thermal management device attenuates EMI in the frequency range by an average of at least 30 dB across the frequency range. In yet other embodiments, a thermal management device attenuates EMI in the frequency range by an average of at least 40 dB across the frequency range.

While reducing the channel cross-sectional area can increase the attenuation of the EM radiation, the reduced channel cross-sectional area will also reduce the airflow through the channel, adversely affecting the thermal management performance Embodiments of fin packs according to the present disclosure increase airflow through channels of the fin pack to improve thermal performance while providing sufficient EMI shielding across the fin pack.

In some embodiments, the fin pack and/or walls of the channels include an electrically conductive material. Examples of suitable materials include, but are not limited to copper, aluminum, iron, tin, magnesium, or alloys thereof; graphite; and electrically conductive polymers. In some embodiments, the fin pack and/or walls of the channels include a thermally conductive material. Examples of suitable materials include, but are not limited to copper, aluminum, iron, tin, magnesium, or alloys thereof; graphite; and thermally conductive polymers.

In some implementations, the thermally conductive material has a thermal conductivity in a range having an upper value, a lower value, or upper and lower values including any of 100 Watts per meter-Kelvin (W/m·K), 125 W/m·K, 150 W/m·K, 175 W/m·K, 200 W/m·K, 250 W/m·K, 300 W/m·K, 400 W/m·K, 450 W/m·K, or any values therebetween. For example, the thermal conductivity may be greater than 100 W/m·K. In other examples, the thermal conductivity may be less than 450 W/m·K. In yet other examples, the thermal conductivity may be between 100 W/m·K and 450 W/m·K. In further examples, the thermal conductivity may be greater than 150 W/m·K. In at least one example, the thermal conductivity may be greater than 250 W/m·K.

In at least one embodiment, the fin pack is made of copper to provide both electrical and thermal conductivity. In another embodiment, the fin pack is made of aluminum to provide both electrical and thermal conductivity. In yet another embodiment, the fin pack is made of a combination of copper in a first portion and aluminum in a second portion to provide different electrical and thermal conductivity properties in the different portions.

In some embodiments, the fin pack contacts and/or is supported by a base. In some embodiments, the base is a heat spreader. In other examples, the base is a part of the housing of the electronic device being cooled. In yet other examples, the base is a heat source. In a conventional fin pack, air is free to move in two dimension between parallel fins. The plurality of channels of a thermal management device according to the present disclosure include an intake between the channels 104 and the base. In some embodiments, the intakes allow the airflow to enter the hot side of the channel before flowing upward through the channels to exit at the cold side of the channels. In some embodiments, the intake is proximate a heat spreader or heat source and the airflow receives heat from the base. In some embodiments, the heat source is thermally connected to another portion of the thermal management device, as will be described in more detail herein, and the intakes allow airflow to enter proximate the base to draw air across thermal conduits that thermally connect the thermal management device to the heat source.

In some embodiments, intakes allow the airflow to flow underneath and into the channels before rising up through the channels and out of the fin pack. The fin pack includes a plurality of bent fins that define a plurality of square channels with a maximum transverse dimension between the corners of the squares. The bent sheets can be individual fins that are stamped to shape and connected to one another (such as by welding, soldering, or a conductive adhesive) to define the channels. In some embodiments, the intakes are formed in the bottom of the fins prior to stamping into the bent form. In some embodiments, the intakes are cut into the fin or fin pack after forming of the bent fins.

In some embodiments, a top edge of the fin is stamped to form the bent pattern that defines a channel, and the fin tapers to a substantially straight bottom edge. When a plurality of fins are positioned with corners of the top edge contacting one another, the resulting fin pack defines a plurality of channels proximate the top edge while defining a plurality of intakes proximate the bottom edge. In some embodiments, the channels formed by a fully tapered fin have a short longitudinal dimension.

In some embodiments, a fin has a straight portion and a tapered portion. In some embodiments, the straight portion has corners similar to the top edge of the fin. The tapered portion transitions the fin from the bent structure of the straight portion to the straight edge at the bottom edge of the fin.

In some embodiments, the straight portion has straight vertical corners that allow a first fin and second fin to contact along a longitudinal length of the corners to form channels. In some embodiments, the tapered portions of the first fin and second fin taper away from the contacting corners and create a continuous space between the first and second fin. The continuous space therebetween provides an intake to the bottom end of the channels, allowing airflow laterally into a fin pack and up through the channels. The channels, therefore, provide both thermal management and EMI shielding in addition to the thermal management provided by the surface area of the tapered portion of the first fin and second fin.

In some embodiments, the channels formed by the first fin and second fin (and any additional fins in contact therewith to form a fin pack) have the channel ratios described herein. For example, the straight portions of the first fin and second fin that form the channels may have the channel ratios described herein independently of the longitudinal dimension of the tapered portion. While the tapered portions contribute to the thermal performance of a thermal management device according to the present disclosure, the tapered portions that do not form a channel are not considered in the channel ratio. As such, the channels formed by the straight portions of the first fin and second fin create a shielding portion of a fin pack, while the tapered portions that do not form channels create a thermal portion of a fin pack.

In some embodiments, the intake has other forms. An intake such as the tunnels described herein through the fin pack can create impedance to moving airflow through, especially in the center of the fin pack. As a heat source may be greatest in temperature near the center, some embodiments benefit from an intake that lowers impedance to airflow through all channels.

In some embodiments, the fin pack forms a plurality of channels therethrough above a base. Because the channels of the fin pack cannot receive air sideways like a conventional parallel fin pack, the bottom of the channels terminate in a sloped plane wherein the longitudinal dimension of the channels vary between channels. The sloped plane allows continued airflow past a first channel to a second channel farther into the fin pack.

As described herein, the longitudinal dimension can vary between channels. In some embodiments, the maximum transverse dimension of a channel can be changed based at least partially on the longitudinal dimension of the channel. For example, the longitudinal dimension of the first channel is less than a longitudinal dimension of the second channel.

In some embodiments, the first channel has a maximum transverse dimension that is less than that of the second channel, and the channel ratio of the first channel and the second channel can be substantially equal. By varying the maximum transverse dimension with the longitudinal dimension, the EMI attenuation can be maintained across the thermal management device.

In some embodiments, a thermal management device can reduce airflow impedance into a channel and/or increase airflow velocity in a channel by angling the intake toward the transverse direction. In some embodiments, at least one channel includes a change of direction, such as a curved portion and/or a discontinuous change of direction. The channel can receive airflow from the side through the intake and into the channel. In some embodiments, a curved portion of the channel can then direct the lateral airflow to change the direction of the airflow upward through channel and exhaust hot air from the thermal management device.

In some embodiments, a channel with a curved portion has a longitudinal dimension that follows the curve of the channel, creating a longer longitudinal dimension of the channel than a vertical height of the channel. The channel ratio is based upon the longitudinal dimension and the maximum transverse dimension, which may allow a curved channel to have a larger maximum transverse dimension than would otherwise be possible for a straight channel of the same vertical height.

While some embodiments of thermal management devices have a shielding portion and a thermal portion that are integrally formed with one another, in some embodiments, the shielding portion and the thermal portion have different structures and are coupled to one another by soldering, welding, brazing, a conductive adhesive, or combinations thereof.

In some embodiments, a thermal portion provides clearance for an intake into a hot side of the channels of the shielding portion. The shielding portion has a maximum transverse dimension and a longitudinal dimension that correspond to a channel ratio, as described herein. In some embodiments, the thermal portion has a thermal height that that provides clearance above a base and/or surface area to dissipate heat.

In some embodiments, the longitudinal dimension of the channel(s) is greater than the thermal height. In some embodiments, the longitudinal dimension of the channel(s) is less than the thermal height. In some embodiments, the longitudinal dimension of the channel(s) is substantially equal to the thermal height. In a particular example, the thermal height of the thermal portion of a thermal management device is 5.0 mm, the longitudinal dimension of a channel of the shielding portion is 5.0 mm, and the maximum transverse dimension of the channel is 2.0 mm Such an example has a channel ratio of 2.5:1 while the total height of the thermal management device is 10.0 mm.

In some embodiments, at least one of the channels is cylindrical or has a circular transverse cross-section as defined by a cylindrical fin or plurality of fins that define a cylinder. In some embodiments, a channel has an elliptical transverse cross-section. While some channels have a circular transverse cross-section, secondary channels therebetween have a non-circular area that is defined by the space between the circles of the cylindrical channels. While the areas of the cylindrical channels and the secondary channels are different, the maximum transverse dimension of the cylindrical channels and the secondary channels is the same.

In some embodiments, one or more channels of a thermal management device can have a linear thermal conduit therein. A linear thermal conduit is any thermal conduit that conductively or convectively transfers heat from a heat source to the thermal management device. In some embodiments, a linear thermal conduit is a wire or rod of thermally conductive material, such as copper, aluminum, iron, carbon, or combinations thereof (such as steel). In some embodiments, a linear thermal conduit is a heat pipe the convectively moves heat from a first interface of the heat pipe to a second interface of the heat pipe.

At the higher temperature ("hot") interface of a heat pipe a liquid in contact with a thermally conductive solid surface turns into a vapor by absorbing heat from that surface. The vapor then travels along the heat pipe to a lower temperature ("cold") interface and condenses back into a liquid releasing the latent heat. The liquid then returns to the hot interface through, for example, capillary action, centrifugal force, or gravity, and the cycle repeats. Due to the high heat transfer coefficients for boiling and condensation, vapor cooling system heat pipes are effective thermal conductors. The effective thermal conductivity varies with heat pipe length and can approach 100 kW/(m K) for long heat pipes, in comparison with approximately 400 W/(m K) for copper.

In some embodiments, a linear thermal conduit is oriented parallel to at least one channel of a thermal management device. In some embodiments, a linear thermal conduit is in a secondary channel of the thermal management device. The linear thermal conduit contacts and transfers heat into a plurality of cylindrical channels of the cylinder array fin pack. In some embodiments, the thermal management device includes a plurality of linear thermal conduits that each contact and transfer heat into 4 cylindrical channels, and each cylindrical channel is adjacent to at least one linear thermal conduit. In some embodiments, cylindrical channels proximate a side of the fin pack may not be adjacent to a linear thermal conduit. In some embodiments, no cylindrical channel is adjacent to more than one linear thermal conduit.

In some embodiments, a thermal management device has a hexagonal close pack (HCP) array (or other close pack array) of channels. Each channel in a HCP array has the same transverse cross-sectional area. Some of the sectors of the HCP array in the fin pack are a linear thermal conduit, which transfers heat into the fin pack. In some embodiments, the linear thermal conduits are distributed through the HCP array such that no hexagonal channel is adjacent to more than one linear thermal conduit while no hexagonal channel is more than one hexagonal channel away from a linear thermal conduit.

In some embodiments, a sheet thermal conduit forms a wall of the channels. In some embodiments, a sheet thermal conduit is a planar sheet thermal conduit. In other embodiments, the sheet thermal conduit has at least one curve or corner therein to complementarily mate between the channels of the fin pack. For example, the sheet thermal conduit may have a plurality of angular corners therein to complementarily mate with and/or form the walls of the hexagonal (or any other shaped) channels. For example, the walls of the hexagonal channels may alternate between a sheet thermal conduit and a solid wall in the direction of the sheet thermal conduit, allowing each channel of the thermal management device to contact a sheet thermal conduit. In some embodiments, each channel of the thermal management device is adjacent to one and only one sheet thermal conduit.

In some embodiments, a sheet thermal conduit is a fin that is continuous from a thermal portion of the thermal management device into the shielding portion of the thermal management device. The fin conducts heat into the shielding portion, wherein the fin pack of the shielding portion further disperses the heat and increases the surface area from which the heat can be transferred to the air and ultimately exhausted from the system.

The sheet thermal conduit may be a solid fin of material or a plurality of pieces of material joined by welding, soldering, conductive adhesive, etc. In some embodiments, the sheet thermal conduit is a vapor chamber that convectively moves heat through the sheet thermal conduit using a working fluid. At a first interface of a vapor chamber a liquid working fluid in contact with a thermally conductive solid surface turns into a vapor phase of the working fluid by absorbing heat from that surface. The vapor working fluid then travels through an interior volume of the vapor chamber to a lower temperature second interface and condenses back into a liquid phase releasing the latent heat. The liquid working fluid then returns to the first interface through, for example, capillary action through a wicking structure, or gravity, and the cycle repeats. Due to the high heat transfer coefficients for boiling and condensation, vapor cooling system vapor chambers are effective thermal conductors similar to a heat pipe.

In some embodiments, the linear thermal conduits are parallel or substantially parallel to the longitudinal direction of the channels. In some embodiments, the linear thermal conduits are oriented perpendicular to or at another non-parallel angle to the longitudinal direction of the channels. For example, the linear thermal conduits pass through a longitudinal center of the fin pack to transfer heat to the longitudinal center of the fin pack. As described herein, the linear thermal conduits are, in some embodiments, connected to a heat source, such as a CPU, GPU, hardware storage device, networking device, etc.

The heat can then conduct through the fin pack in either longitudinal direction to spread the heat before airflow through the channels exhausts the heat from the thermal management device. As the EMI shielding or attenuation provided by the channels is related to the channel ratio (of the longitudinal dimension to the maximum transverse dimension), the fin pack has a relatively long longitudinal dimension relative to conventional fin packs. In some embodiments, linear thermal conduits (or sheet thermal conduit) can take advantage of the relatively long longitudinal dimension by delivering heat to the longitudinal center. In doing so, the thermal management device can distribute heat in opposite directions from the linear thermal conduits, effectively performing similar to two conventional fin packs connected to a hot surface.

In at least one embodiment according to the present disclosure, a thermal management device can increase both thermal performance and EMI attenuation relative to a conventional faraday cage and fin pack by combining the two into a single structure. Embodiments described herein provide intakes to increase airflow therethrough and reduce impedances to the airflow introduced by the elongated channels.

The present disclosure relates to systems and methods for thermal management and electromagnetic interference (EMI) or radio frequency (RF) shielding according to at least the examples provided in the sections below:

[A1] In some embodiments, a thermal management device includes a fin pack and a plurality of channels. The fin pack has a hot side and a cold side, and the plurality of channels in the fin pack provide fluid communication from the hot side to the cold side. The channels have a transverse dimension and a longitudinal dimension, and the longitudinal dimension is at least 2.5 times the transverse dimension.

[A2] In some embodiments, at least one of the channels of [A1] is curved in a longitudinal direction between the hot side and the cold side.

[A3] In some embodiments, all of the channels of [A1] are curved in a longitudinal direction between the hot side and the cold side.

[A4] In some embodiments, a first channel of the plurality of channels of any of [A1] through [A3] is shorter in the longitudinal dimension than a second channel of the plurality of channels.

[A5] In some embodiments, the thermal management device of any of [A1] through [A4] includes an intake tunnel connecting at least two channels of the plurality of channels.

[A6] In some embodiments, the fin pack of any of [A1] through [A5] includes a plurality of ridged fins, and a displacement between peaks of at least one ridged fin is less proximate the hot side than the cold side.

[A7] In some embodiments, at least one channel of any of [A1] through [A6] is circular in a transverse direction.

[A8] In some embodiments, at least one channel of any of [A1] through [A7] is hexagonal in a transverse direction.

[A9] In some embodiments, a thermal management device includes a thermal portion and a shielding portion. The thermal portion is proximate a hot side of the thermal management device, and the shielding portion is proximate a cold side opposite the hot side. The thermal portion is configured to receive heat from a heat source. The shielding portion includes plurality of channels that provide fluid communication from the hot side to the cold side. The channels have a transverse dimension and a longitudinal dimension, and the longitudinal dimension is at least 2.5 times the transverse dimension.

[A10] In some embodiments, at least part of the thermal portion and the shielding portion of [A9] is integrally formed from a single sheet of metal.

[A11] In some embodiments, the thermal portion of [A9] or [A10] includes a plurality of parallel fins.

[A12] In some embodiments, a longitudinal dimension of the plurality of channels of any of [A9] through [A11] is greater than a height of the thermal portion.

[A13] In some embodiments, an electronic device includes a heat source and a thermal management device thermally connected to the heat source. The thermal management device includes a fin pack and a plurality of channels. The fin pack has a hot side and a cold side, and the plurality of channels in the fin pack provide fluid communication from the hot side to the cold side. The channels have a transverse dimension and a longitudinal dimension, and the longitudinal dimension is at least 2.5 times the transverse dimension.

[A14] In some embodiments, the electronic device of [A13] includes a linear thermal conduit thermally connecting the heat source to the thermal management device.

[A15] In some embodiments, the linear thermal conduit of [A14] is connected to the fin pack at least partially transverse to a longitudinal direction of the channels.

[A16] In some embodiments, the linear thermal conduit of [A14] is connected to the fin pack parallel to a longitudinal direction of the channels and adjacent to at least one channel.

[A17] In some embodiments, the hot side of the fin pack of any of [A13 through [A16] contacts a heat spreader, and the heat spreader is thermally between the heat source and the fin pack.

[A18] In some embodiments, the electronic device of [A17] includes an intake between the hot side of at least one channel and the heat spreader.

[A19] In some embodiments, the intake of [A18] is a plane that is non-perpendicular to a longitudinal direction of the channels.

[A20] In some embodiments, the heat source of any of [A13] through [A19] is a processor.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A thermal management device comprising:
    a fin pack having a hot side and a cold side;
    a plurality of channels in the fin pack that provide fluid communication in a longitudinal direction from the hot side to the cold side, the channels have a transverse dimension and a longitudinal dimension, wherein the longitudinal dimension is at least 2.5 times the transverse dimension; and an intake into the plurality of channels configured to receive airflow in a transverse direction into the plurality of channels, wherein the airflow exits the plurality of channels in the longitudinal direction.

2. The thermal management device of claim 1, wherein at least one of the channels is curved in a longitudinal direction between the hot side and the cold side.

3. The thermal management device of claim 1, wherein all of the channels are curved in a longitudinal direction.

4. The thermal management device of claim 1, wherein a first channel of the plurality of channels is shorter in the longitudinal dimension than a second channel of the plurality of channels.

5. The thermal management device of claim 1, wherein the intake is an intake tunnel connecting at least two channels of the plurality of channels.

6. The thermal management device of claim 1, wherein the fin pack includes a plurality of bent fins having a plurality of corners proximate to the cold side and a straight edge proximate to the hot side.

7. The thermal management device of claim 1, wherein the at least one of the channels of the plurality of channels is circular in a transverse direction.

8. The thermal management device of claim 1, wherein at least one channel of the plurality of channels is hexagonal in transverse direction.

9. A thermal management device:
a thermal portion proximate a hot side and configured to receive heat from a heat source, the hot side including an intake into a plurality of channels configured to receive airflow in a transverse direction into the plurality of channels of the fin pack, wherein the airflow exits the plurality of channels in the longitudinal direction; and
a shielding portion proximate a cold side and opposite the hot side, the shielding portion including:
the plurality of channels that provide fluid communication from the hot side to the cold side, the channels have a transverse dimension and a longitudinal dimension, wherein the longitudinal dimension is at least 2.5 times the transverse dimension.

10. The thermal management device of claim 9, wherein at least part of the thermal portion and the shielding portion is integrally formed from a single sheet of metal.

11. The thermal management device of claim 9, wherein the thermal portion includes a plurality of parallel fins.

12. The thermal management device of claim 9, wherein a longitudinal dimension of the plurality of channels is greater than a height of the thermal portion.

13. An electronic device comprising:
a heat source; and
a thermal management device thermally connected to the heat source, the thermal management device including:
a fin pack having a hot side and a cold side,
a plurality of channels in the fin pack that provide fluid communication in a longitudinal direction from the hot side to the cold side, the channels have a transverse dimension and a longitudinal dimension, wherein the longitudinal dimension is at least 2.5 times the transverse dimension, and
an intake into the plurality of channels configured to receive airflow in a transverse direction into the plurality of channels, wherein the airflow exits the plurality of channels in the longitudinal direction.

14. The electronic device of claim 13 further comprising a linear thermal conduit thermally connecting the heat source to the thermal management device.

15. The electronic device of claim 14, wherein the linear thermal conduit is connected to the fin pack at least partially transverse to a longitudinal direction of the channels.

16. The electronic device of claim 14, wherein the linear thermal conduit is connected to the fin pack parallel to a longitudinal direction of the channels and adjacent to at least one channel.

17. The electronic device of claim 14, wherein the hot side of the fin pack contacts a heat spreader, and the heat spreader is thermally between the heat source and the fin pack.

18. The electronic device of claim 13, wherein the intake is between the hot side of at least one channel and the heat spreader.

19. The electronic device of claim 13, wherein the intake is a plane that is non-perpendicular to a longitudinal direction of the channels.

20. The electronic device of claim 13, wherein the heat source is a processor.

* * * * *